United States Patent [19]

Chintapalli et al.

[11] Patent Number: 5,159,600
[45] Date of Patent: Oct. 27, 1992

[54] ARRANGEMENT FOR GENERATING AN OPTIMAL SET OF VERIFICATION TEST CASES

[75] Inventors: Ankineedu P. Chintapalli, Middletown, N.J.; Shankar S. Hegde, Westford, Mass.; Madhav S. Phadke, Tinton Falls, N.J.

[73] Assignee: AT&T Bell Laboratories, Murray Hill, N.J.

[21] Appl. No.: 459,866

[22] Filed: Jan. 2, 1990

[51] Int. Cl.⁵ .............................................. G06F 15/21
[52] U.S. Cl. ...................................... 371/27; 364/580
[58] Field of Search ........................... 371/27; 364/580

[56] References Cited

PUBLICATIONS

*Communications of the ACM*, "Orthogonal Latin Squares: An Applic. of Experimental Design to Compiler Testing", R. Mandl, Oct. 1985, vol. 28, No. 10, pp. 1054–1058.
*Quality Engineering Using Robust Design*, Ch. 7, "Constructing Orthogonal Arrays", Prentice-Hall, M. S. Phadke, pp. 149–182.
*Fujitsu Limited*, "Software Test Item Determination By Experimentl. Design Method," Comm. & Electronics, Tokyo, Japan, pp. 1–10, undated.
140 Miyamoto, Numazu-shi, Shizuoka, 410-03, Japan, "Test Case Design Support System," K. Tatsumi, undated, pages unnumbered.
Ross P., *Taguchi Techniques for Quality Engineering*, copyright 1988 by McGraw-Hill, Inc., pp. 68–113.

*Primary Examiner*—Stephen M. Baker
*Attorney, Agent, or Firm*—F. B. Luludis

[57] ABSTRACT

A facility is provided for generating from a series of parameters (factors) and their respective values (levels) inputted by a user a plurality of test cases using an orthogonal array selected from a library of such arrays, in which the selection is optimized by characterizing the arrays by respective cumulative level vectors and converting the user input into a cumulative level input vector. The smallest array for generating the test cases is then selected on the basis that the values of the input vector are no larger than the corresponding values of the cumulative level vector characterizing the selected array.

8 Claims, 11 Drawing Sheets

FIG.1

| ORTHOGONAL ARRAY | NUMBER OF ROWS | NUMBER OF FACTORS | NUMBER OF LEVELS | | | | |
|---|---|---|---|---|---|---|---|
| | | | 2 | 3 | 4 | 5 | 6 |
| L4 | 4 | 3 | 3 | 0 | 0 | 0 | 0 |
| L8 | 8 | 7 | 7 | 0 | 0 | 0 | 0 |
| L9 | 9 | 4 | 0 | 4 | 0 | 0 | 0 |
| L12 | 12 | 11 | 11 | 0 | 0 | 0 | 0 |
| L16 | 16 | 15 | 15 | 0 | 0 | 0 | 0 |
| L16a2 | 16 | 13 | 12 | 0 | 1 | 0 | 0 |
| L16a3 | 16 | 11 | 9 | 0 | 2 | 0 | 0 |
| L16a4 | 16 | 9 | 6 | 0 | 3 | 0 | 0 |
| L16a5 | 16 | 7 | 3 | 0 | 4 | 0 | 0 |
| L16a6 | 16 | 5 | 0 | 0 | 5 | 0 | 0 |
| L18 | 18 | 8 | 1 | 7 | 0 | 0 | 0 |
| L18a2 | 18 | 7 | 0 | 6 | 0 | 0 | 1 |
| L25 | 25 | 6 | 0 | 0 | 0 | 6 | 0 |
| L27 | 27 | 13 | 0 | 13 | 0 | 0 | 0 |
| L32 | 32 | 31 | 31 | 0 | 0 | 0 | 0 |
| L32a2 | 32 | 10 | 1 | 0 | 9 | 0 | 0 |
| L36 | 36 | 23 | 11 | 12 | 0 | 0 | 0 |
| L36a2 | 36 | 16 | 3 | 13 | 0 | 0 | 0 |
| L50 | 50 | 12 | 1 | 0 | 0 | 11 | 0 |
| L54 | 54 | 26 | 1 | 25 | 0 | 0 | 0 |
| L64 | 64 | 63 | 63 | 0 | 0 | 0 | 0 |
| L64a2 | 64 | 21 | 0 | 0 | 21 | 0 | 0 |
| L81 | 81 | 40 | 0 | 40 | 0 | 0 | 0 |

FIG.2
| FACTOR | NO. OF LEVELS | LEVELS |
|---|---|---|
| F1 | 3 | a,b,c |
| F2 | 2 | d,D |
| F3 | 3 | e,f,j |
| F4 | 3 | K,l,m |
| F5 | 5 | S,T,U,V,W |
FIG.3
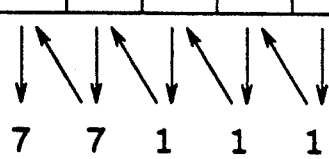
FIG.4
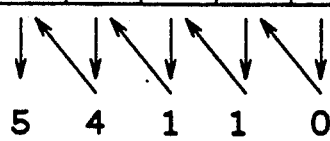

FIG.5

| ORTHOGONAL ARRAY | NUMBER OF ROWS | NUMBER OF FACTORS | NUMBER OF CUMULATIVE LEVELS | | | | |
|---|---|---|---|---|---|---|---|
| | | | 2 | 3 | 4 | 5 | 6 |
| L4 | 4 | 3 | 3 | 0 | 0 | 0 | 0 |
| L8 | 8 | 7 | 7 | 0 | 0 | 0 | 0 |
| L9 | 9 | 4 | 4 | 4 | 0 | 0 | 0 |
| L12 | 12 | 11 | 11 | 0 | 0 | 0 | 0 |
| L16 | 16 | 15 | 15 | 0 | 0 | 0 | 0 |
| L16a2 | 16 | 13 | 13 | 1 | 1 | 0 | 0 |
| L16a3 | 16 | 11 | 11 | 2 | 2 | 0 | 0 |
| L16a4 | 16 | 9 | 9 | 3 | 3 | 0 | 0 |
| L16a5 | 16 | 7 | 7 | 4 | 4 | 0 | 0 |
| L16a6 | 16 | 5 | 5 | 5 | 5 | 0 | 0 |
| L18 | 18 | 8 | 8 | 7 | 0 | 0 | 0 |
| L18a2 | 18 | 7 | 7 | 7 | 1 | 1 | 1 |
| L25 | 25 | 6 | 6 | 6 | 6 | 6 | 0 |
| L27 | 27 | 13 | 13 | 13 | 0 | 0 | 0 |
| L32 | 32 | 31 | 31 | 0 | 0 | 0 | 0 |
| L32a2 | 32 | 10 | 10 | 9 | 9 | 0 | 0 |
| L36 | 36 | 23 | 23 | 12 | 0 | 0 | 0 |
| L36a2 | 36 | 16 | 16 | 13 | 0 | 0 | 0 |
| L50 | 50 | 12 | 12 | 11 | 11 | 11 | 0 |
| L54 | 54 | 26 | 26 | 25 | 0 | 0 | 0 |
| L64 | 64 | 63 | 63 | 0 | 0 | 0 | 0 |
| L64a2 | 64 | 21 | 21 | 21 | 21 | 0 | 0 |
| L81 | 81 | 40 | 40 | 40 | 0 | 0 | 0 |

```
> OATS
> FACTOR
>  ———————  NAME F1
>  ———————  ORDER 1
>  ———————  LEVELS
>  ———————  ——— 0 ——— a
>  ———————  ——— 1 ——— b
>  ———————  ——— 2 ——— c
> FACTOR
>  ———————  NAME F2
>  ———————  ORDER 2
>  ———————  LEVELS
>  ———————  ——— 0 ——— d
>  ———————  ——— 1 ——— D
            ⋮
> FACTOR
>  ———————  NAME F5
>  ———————  ORDER 5
>  ———————  LEVELS
>  ———————  ——— 0 ——— S
            ⋮
>  ———————  ——— 4 ——— W
> COMMAND
>  ———————  CTYPE  ——— MAIN
>  ———————  CMD    ——— XYZ
> CTLD
```

FIG.8

| EXPERIMENT NO. | COLUMNS | | | | | | |
|---|---|---|---|---|---|---|---|
| | 1 | 2 | 3 | 4 | 5 | 6 | 7 |
| 1 | 1 | 1 | 1 | 1 | 1 | 1 | 1 |
| 2 | 1 | 2 | 2 | 2 | 2 | 2 | 2 |
| 3 | 1 | 3 | 3 | 3 | 3 | 3 | 3 |
| 4 | 2 | 1 | 1 | 2 | 2 | 3 | 3 |
| 5 | 2 | 2 | 2 | 3 | 3 | 1 | 1 |
| 6 | 2 | 3 | 3 | 1 | 1 | 2 | 2 |
| 7 | 3 | 1 | 2 | 1 | 3 | 2 | 3 |
| 8 | 3 | 2 | 3 | 2 | 1 | 3 | 1 |
| 9 | 3 | 3 | 1 | 3 | 2 | 1 | 2 |
| 10 | 4 | 1 | 3 | 3 | 2 | 2 | 1 |
| 11 | 4 | 2 | 1 | 1 | 3 | 3 | 2 |
| 12 | 4 | 3 | 2 | 2 | 1 | 1 | 3 |
| 13 | 5 | 1 | 2 | 3 | 1 | 3 | 2 |
| 14 | 5 | 2 | 3 | 1 | 2 | 1 | 3 |
| 15 | 5 | 3 | 1 | 2 | 3 | 2 | 1 |
| 16 | 6 | 1 | 3 | 2 | 3 | 1 | 2 |
| 17 | 6 | 2 | 1 | 3 | 1 | 2 | 3 |
| 18 | 6 | 3 | 2 | 1 | 2 | 3 | 1 |
| 0 | 6 | 3 | 3 | 3 | 3 | 3 | 3 |

| TEST CASE NO. | PARAMETERS | | | | | |
|---|---|---|---|---|---|---|
| | CMD | F1 | F2 | F3 | F4 | F5 |
| 1 | xyz | 'a' | 'd' | 'e' | 'k' | 'S' |
| 2 | xyz | 'b' | 'D' | 'f' | 'l' | 'S' |
| 3 | xyz | 'c' | 'D' | 'g' | 'm' | 'S' |
| 4 | xyz | 'c' | 'D' | 'g' | 'l' | 'T' |
| 5 | xyz | 'a' | 'D' | 'e' | 'm' | 'T' |
| 6 | xyz | 'b' | 'd' | 'f' | 'k' | 'T' |
| 7 | xyz | 'c' | 'd' | 'f' | 'm' | 'U' |
| 8 | xyz | 'a' | 'D' | 'g' | 'k' | 'U' |
| 9 | xyz | 'b' | 'D' | 'e' | 'l' | 'U' |
| 10 | xyz | 'a' | 'D' | 'f' | 'l' | 'V' |
| 11 | xyz | 'b' | 'd' | 'g' | 'm' | 'V' |
| 12 | xyz | 'c' | 'D' | 'e' | 'k' | 'V' |
| 13 | xyz | 'b' | 'D' | 'g' | 'k' | 'W' |
| 14 | xyz | 'c' | 'd' | 'e' | 'l' | 'W' |
| 15 | xyz | 'a' | 'D' | 'f' | 'm' | 'W' |
| 16 | xyz | 'b' | 'D' | 'e' | 'm' | 'W' |
| 17 | xyz | 'c' | 'D' | 'f' | 'k' | 'W' |
| 18 | xyz | 'a' | 'd' | 'g' | 'l' | 'W' |

FIG.10

| FACTOR | NO. OF LEVELS | LEVELS |
|---|---|---|
| F1 | 5 | a,b,c,d,e |
| F2 | 3 | f,g,h |
| F3 | 4 | 0,1,60,24 — 901<br>0,1,60,24 — 902<br>0,1,16,8 — 903 |
| F4 | 4 | o,az,za,bw |

FIG.11

| EXPERIMENT NO. | 1 | 2 | 3 | 4 | 5 | 6 |
|---|---|---|---|---|---|---|
| 1 | 1 | 1 | 1 | 1 | 1 | 1 |
| 2 | 1 | 2 | 2 | 2 | 2 | 2 |
| 3 | 1 | 3 | 3 | 3 | 3 | 3 |
| 4 | 1 | 4 | 4 | 4 | 4 | 4 |
| 5 | 1 | 5 | 5 | 5 | 5 | 5 |
| 6 | 2 | 1 | 2 | 3 | 4 | 5 |
| 7 | 2 | 2 | 3 | 4 | 5 | 1 |
| 8 | 2 | 3 | 4 | 5 | 1 | 2 |

| TEST CASE NO. | PARAMETERS | | | |
|---|---|---|---|---|
| | F4 | F3 | F2 | F1 |
| 1 | 0 | 0 | f | a |
| 2 | az | 1 | g | b |
| 3 | za | 16 | h | c |
| 4 | bw | 8 | h | d |
| 5 | bw | 8 | h | e |
| 6 | az | 16 | h | e |
| 7 | za | 8 | h | a |
| 8 | bw | 24 | f | b |

FIG.14

| TEST CASE | FACTORS | | | | | | | | |
|---|---|---|---|---|---|---|---|---|---|
| | 1 | 2 | 3 | 4 | 5 | 6 | 7 | 8 | 9 |
| 1 | 1 | 1 | 1 | 1 | 1 | 1 | 1 | 1 | 1 |
| 2 | 1 | 1 | 1 | 2 | 2 | 2 | 2 | 2 | 2 |
| 3 | 2 | 2 | 2 | 1 | 1 | 1 | 2 | 2 | 2 |
| 4 | 1 | 2 | 2 | 1 | 2 | 2 | 1 | 1 | 2 |
| 5 | 2 | 1 | 2 | 2 | 1 | 2 | 1 | 2 | 1 |
| 6 | 2 | 2 | 1 | 2 | 2 | 1 | 2 | 1 | 1 |
| 7 | 2 | 2 | 1 | 1 | 2 | 2 | 1 | 2 | 1 |
| 8 | 2 | 1 | 2 | 2 | 2 | 1 | 1 | 1 | 2 |
| 9 | 1 | 2 | 2 | 2 | 1 | 2 | 2 | 1 | 1 |
| 10 | 2 | 1 | 1 | 1 | 1 | 2 | 2 | 1 | 2 |
| 11 | 1 | 2 | 1 | 2 | 1 | 1 | 1 | 2 | 2 |
| 12 | 1 | 1 | 2 | 1 | 2 | 1 | 2 | 2 | 1 |

ARRANGEMENT FOR GENERATING AN OPTIMAL SET OF VERIFICATION TEST CASES

TECHNICAL FIELD

The invention relates to the testing of electronic devices and software programs and more particularly relates to generating an optimal set of test cases to perform such testing.

BACKGROUND OF THE INVENTION

There is always a need for testing the design of a product, such as an electronic device, software program, etc., to verify that the product consistently performs its intended function before it is offered for sale. Briefly, testing a new design may be thought of as performing a matrix of experiments consisting of a set of independent parameters whose levels or values are changed from one experiment to the next and recording the results. The results are then analyzed to verify the effectiveness of the particular design. In the past, the test factors and levels required to adequately test a particular product were devised by the designer, relying solely on his/her knowledge of the specific design and its resulting behavior. However, as a result of electronic devices and software programs becoming more complex, the task of devising such test factors and the values that each factor should employ as well as which combinations thereof to use has become increasingly difficult. Accordingly, the testing phase of a product now consumes approximately 30–40% of the total development effort and is, therefore, becoming a significant cost component in the price of such devices and software.

To address this problem, designers are now employing different methods to help simplify the generation of test patterns (cases). One such method employs what is commonly referred to as orthogonal arrays. Orthogonal arrays, also known as Latin Squares, have been used one way or another since the days of Euler, and, more recently, have proved to be effective in generating test cases for testing software down to a fault level of, for example, two faults per million lines of code.

To use orthogonal arrays, a designer maps, for example, a software command, into a 2-tuple (matrix) defining the number of factors (parameters) for the command and the number of levels associated with each factor. The designer then manually searches through a library of orthogonal arrays to hopefully match the 2-tuple with an optimal orthogonal array. Therein lies the problem, since it is often the case that the designer may not recognize which one of the orthogonal arrays optimally covers the 2-tuple. As a result, the designer may end up selecting an inefficient array, rather than the array that is optimally suited for generating the desired test cases.

SUMMARY OF THE INVENTION

An advancement over the prior art is achieved by providing a test generation tool which selects, based on test parameters (factors) and their associated values (levels) inputted by the user of the tool, the smallest orthogonal array optimally suited for generating the associated test cases. The tool then goes on to generate and output to an output device, such as, for example, a computer monitor, the associated set of test cases. Thus, all that the user needs to do is to enter test factors and their associated levels.

Specifically, the selection of an orthogonal array is optimized, in accordance with an aspect of the invention, by characterizing each of the orthogonal arrays by a respective cumulative level vector and forming the user's input into a respective cumulative level input vector. The smallest orthogonal array optimally suited for generating the test cases is then selected based on a predetermined relationship between the input vector and the cumulative level vector characterizing the selected array. In an illustrative embodiment of the invention, the relationship may be based on, for example, that the values of the input vector are no larger than corresponding values of the cumulative vector associated with the selected array.

BRIEF DESCRIPTION OF THE DRAWING

In the drawing:

FIG. 1 illustrates a library of well-known orthogonal arrays that may be used in the practice of the invention;

FIG. 2 illustrates in table form various factors and levels associated with a fictitious experiment;

FIG. 3 illustrates the manner in which a number of factors and respective levels characterizing a particular one of the arrays of FIG. 1 may be converted into a cumulative level vector, in accordance with the principles of the invention;

FIG. 4 illustrates the manner in which the factors and levels of FIG. 2 may be converted into a cumulative level input vector, in accordance with the principles of the invention;

FIG. 5 shows the library of FIG. 1 in alternate form;

FIG. 8 illustrates one of the arrays listed in the library of FIGS. 1 and 5;

FIG. 9 shows in table form the test cases that are generated using the array of FIG. 8, in which the test cases are generated in accordance with the principles of the invention;

FIGS. 10–12 illustrate an example of generating test cases in the case where there is dependency between the levels of different test factors;

FIGS. 13–14 illustrate an actual application of the present invention;

DETAILED DESCRIPTION

Figures 6, 7:
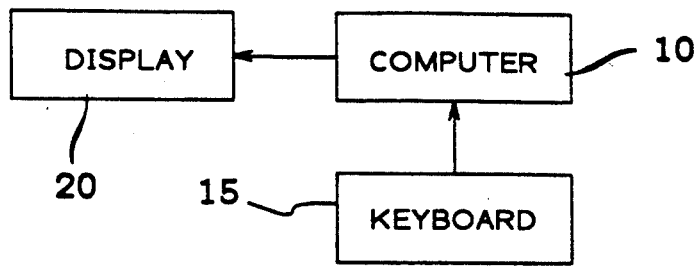
FIG. 6 shows a computer arrangement in which the present invention may be illustratively implemented.
FIG. 7 illustrates the manner in which a user enters into the arrangement of FIG. 6 the factors and levels associated with a particular experiment.
Figure 13:
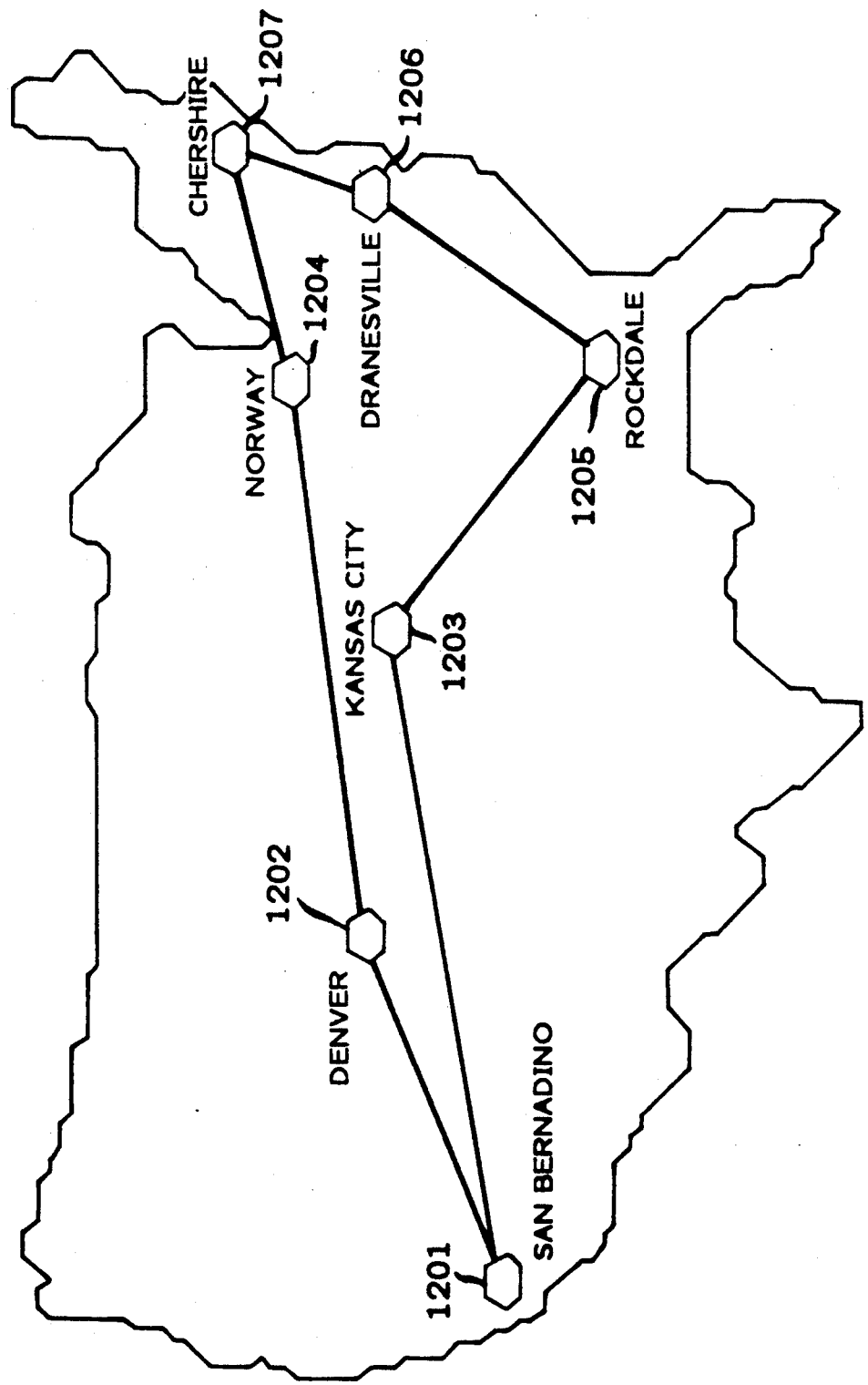

To select one of a plurality of standard orthogonal arrays, a user must first define at least (a) the number of factors (parameters) to be tested and (b) the number of levels for each such factor. (It is noted that hereinafter the terms "parameter" and "factor" will be used interchangeably and the terms "level" and "value" will also be used interchangeably.) Following the foregoing, the user then determines the total number of degrees of freedom to define the minimum number of experiments that need to be conducted to study all of the selected control factors. The number of degrees of freedom associated with a factor is equal to one less than the number of levels chosen for that factor. In addition, one degree of freedom is associated with the overall mean regardless of the number of control factors that will be used to formulate the test cases.

For example, assume that a particular project (experiment) calls for seven 2-level factors. The total number of degrees of freedom for the experiment is then eight- one for the overall mean, and seven for the 2-level factors ((i.e., $7 \times (2-1)$)).

Turning now to FIG. 1, there is shown a TABLE 1 identifying a number of different orthogonal arrays. Specifically, TABLE 1 identifies the total number of rows and columns in each of the identified arrays as well as the manner in which respective levels are distributed across the columns. For example, the orthogonal array identified as L4 has four rows and three columns, in which each of the columns has two levels. As a further example, the array identified as L16a2 has 16 rows and 13 columns, in which 12 of the columns each have two levels and in which one column has four levels.

In order for a particular orthogonal array to be a viable choice in defining a set of test cases, the number of rows of the array must be at least equal to the number of degrees of freedom calculated for the particular experiment. Thus, in the case of the above example having eight degrees of freedom, the array identified as L8 would be the most viable choice, since it has eight rows and seven columns with each column having two-levels.

As another illustrative example, assume that an experiment has one 2-level factor, three 3-level factors and one 5-level factor, as depicted in FIG. 2. In FIG. 2, the letters shown in the column labeled "LEVELS" represent respective values that may be assumed by the associated factors. For example, factor F2 may take one of two values represented by d and D, respectively. For this experiment the number of degrees of freedom equals twelve ($(2-1)+3(3-1)+(5-1)+1$). Since the experiment has twelve degrees of freedom, it would appear that an orthogonal array having at least twelve rows would be the most viable choice for specifying an optimal set of test cases. The library shown in FIG. 1 lists only one array having twelve rows, namely array L12. Although array L12 would be a good choice for specifying the test cases for those experiments having eleven 2-level factors, it would not be good choice for the experiment of FIG. 2, since array L12 cannot be used to specify test cases for factors having 3 levels and factors having 5 levels. Accordingly, the designer would have to consider using a larger array.

However, an examination of the library of FIG. 1 does not readily reveal which one of the arrays identified therein would be the best choice for an experiment having one 2-level factor, three 3-level factors and one 5-level factor. Therein lies the nub of the problem, i.e., which one of the orthogonals arrays should the designer select to generate an optimal set of test cases for the presumed experiment. We have found that, typically, the selection of an array is not an easy task and requires the designer to be well versed in orthogonal arrays. Moreover, we have investigated ways of automating the process, in which all that the designer would have to do is to enter the number of factors and their respective levels into automated equipment via, for example, a computer keyboard. The automated equipment would then select an optimal orthogonal array and generate the test case using the selected array.

However, we have found that the design of the algorithm that selects the array proved to be complex and subject to the failure.

The problem of selecting an orthogonal array may be greatly simplified, however, by, in accordance with an aspect of the invention, transforming the values of the levels specified for the arrays listed in FIG. 1 into what we call Cumulative Level Vectors (CLV). Specifically, we treat the values of the levels specified for a given array as an array vector. We then generate a respective CLV from the array vector. That is, the first value of a CLV is the first value of the array vector. The first value of the CLV is then added to the second value of the array vector to generate the second value of the CLV. The second value of the CLV is then added to the third value of the array vector to generate the third value of the CLV. The third value of the CLV is then added to the fourth value of the array vector to generate the fourth value of the CLV and so on. Thus, the last value of the CLV is accumulated with the next value of the array vector to generate the next value of the CLV.

The foregoing process is depicted in FIG. 3, which graphically shows how the array vector 06001 representing orthogonal array L18a2 is converted into a respective CLV, 77111. One important property of a CLV is that it readily identifies the manner in which the various factor levels, two through six, may be distributed across the number of factors supported by the respective orthogonal array. For example, the CLV 77111 for array L18a2 indicates that the seven factors supported by that array may be used in an experiment having, for example, seven 2-level factors, or seven 3-level factors, or one 4-level factor, one 5-level factor and one 6-level factor, respectively.

In addition, we also convert the various factor levels that may be specified for a particular experiment into a cumulative level vector to further simplify the search for the optimal array. To differentiate between the CLV for an orthogonal array and a CLV defining the levels of respective factors (input vector) associated with an experiment, we designate the latter as CLV-E. In particular, a CLV-E is generated from the input vector in same manner as a CLV is generated for a respective orthogonal array. For example, FIG. 4 depicts, in alternate form, the input vector for the experiment shown in FIG. 2. As mentioned above, the input vector for the experiment specifies one 2-level factor, three 3-level factors and one 5-level factor (13010). As shown in the FIG., the resulting CLV-E is 54110, which is obtained by applying the cumulative level procedure, discussed above, to the input vector 13010.

To further facilitate the matching of a CLV-E with an optimal orthogonal array, the array vectors shown for the orthogonal arrays listed in TABLE 1 of FIG. 1 are replaced by their respective CLV vectors, as shown in FIG. 5. It is readily apparent from FIG. 5 that orthogonal array L18a2 would be the optimum choice for specifying the test cases for the experiment of FIG. 2. The reason for this is that the CLV-E (54110) derived for the experiment is optimally covered by the CLV (77111) derived for array L18a2. That is, each digit of the CLV-E is no larger than the corresponding digit of the CLV. Thus, the search for an optimal orthogonal array is greatly simplied as a result of converting the array vectors into respective CLV vectors and as a result of converting the input vector into a respective CLV-E vector.

It can be readily appreciated from the foregoing that the search for an optimal orthogonal array may be readily automated such that all that a user (e.g., circuit or software designer) has to do is to input an input vector. The automatic means-illustratively a computer-will then search a stored library of orthogonal arrays, such as the library of FIG. 5, select the optimal orthogonal array based on the input vector and output the array of test cases. Advantageously then, the designer needs no prior knowledge of orthogonal arrays in order to generate an optimal set of test cases.

Turning then to FIG. 6, there is shown computer 10, which is arranged to automate the selection of an optimal orthogonal array and generate respective test cases based on the selected array. Computer 10 may be, for example, the HP 9000/860 available from the well-known Hewlet-Packard company. In our arrangement, the HP 9000/860 operates under the control of a particular operating system, such as, for example, the well-known UNIX ® operating system. Alternatively, computer 10 could be a so-called personal computer, such as, for example, the PC6300 plus available from AT&T. Specifically, to generate a set of test cases for a particular experiment the user invokes a test case generation tool, which implements the invention on computer 10. The user does this by entering via keyboard 15 a respective command in response to a prompt that computer 10 displays on display 20, the command being, for example, OATS (i.e., orthogonal array test system). The user then proceeds to enter the factors and their respective levels as well as the identity of the associated parameters, as shown in FIG. 7.

FIG. 7 illustrates the manner in which the user enters the data associated with the experiment of FIG. 2. In particular, the user enters the term "FACTOR" and, at the next prompt, enters a TAB (represented by the solid line) and then enters the term "NAME" followed by the name of the factor, which, in the present case, is F1. At the next prompt (>), the user enters a TAB, then the term "order" followed by a number identifying the order that the associated factor, e.g., F1, is to be entered on the command line of the associated test case. In the present instance, factor F1 would be ordered first on the command line, as indicated by the value of 1. At the next prompt, the user enters a TAB followed by the term "Levels". The user then enters the value for each level associated with the named factor. As noted above, factor F1 is one of three 3-level factors. Accordingly, the user enters for that factor, via keyboard 15, three levels identified by the values 0, 1 and 2, in which each such level is followed by its respective value. As seen in the FIG., the user has entered the values a, b and c for factor F1. The user then enters the levels and parameters associated with the remaining factors, as shown in the FIG.

As an aspect of the invention, the user may associate the test case data that he/she enters with a particular command. The user does this simply by entering (a) the term "command" (b) the type of command (e.g., "ctype"—"main") and (c) the identity of the particular command (e.g., "cmd"—"xyz"). It is noted that the command "xyz" is a fictitious command. The user then enters "control D" representing the end of the input file. (It is noted that each solid line depicted in the FIG. represents the entry of a keyboard tab, as mentioned above.)

Responsive to the input, the test case generation tool (hereinafter "tool") forms the input vector and converts it to a CLV-E vector. Armed with the latter vector, the tool then searches through the library depicted in FIG. 5 to select the orthogonal array that is optimally suited for generating the respective test cases (which library is stored in the memory of computer 10). (As mentioned above, the optimal orthogonal array is the smallest array in which the value of each digit of the CLV-E is no larger than the value of the corresponding digit of the associated CLV.) Accordingly, the tool will select orthogonal array L18a2 as the optimal array for generating the test cases.

Turning then to FIG. 8, there is shown orthogonal array L18a2, which the tool may unload from the memory of computer 10. It is noted that row 0, which is shown at the bottom of the array and which is not part of the array, notes the largest value in the associated column and, as will soon be explained, is used to aid the tool in assigning the named factors inputted by the user to respective columns of the array. For example, the value six in row 0 indicates that the highest level contained in column 1 of the array is a six. The remaining values of three in row 0 indicate that the highest level contained in columns 1 through 7 is a three, respectively.

Accordingly, the tool uses the information provided in row 0 to quickly assign factors to respective columns. In doing so, the tool starts with—illustratively column 7—and proceeds to the left towards column 1. However, before proceeding in that manner, the tool first assigns factor F5 to column 1, since that column is the only column in the array having a sufficient number of levels to cover the five levels associated with factor F5. The tool then assigns the next lower levels, namely, factors F1, F3 and F4 each having three levels to columns one, two and three, respectively. The tool then assigns the next lower level, namely, factor F2 having two levels, to column four. The tool then generates the respective cases using columns 2 and 4 through 7 of array L18a2. It is noted, however, that column 1 serves six levels while factor F5 has only five levels. To handle this case, the tool is arranged, in accordance with an aspect of the invention, to increase factor F5 to six levels by padding factor F5 with a so-called dummy level and assigning a predetermined parameter to the padded level. In our arrangement, when a factor needs to be padded with a dummy level, then we assign to that level one of the parameters already associated with the respective factor, as shown in FIG. 9.

Specifically, FIG. 9 shows the eighteen test cases that the tool has generated employing the orthogonal array of FIG. 8. It is seen that for each level six in column 1 (rows 16 through 18) of the array, the tool has padded those levels with a dummy level, namely, the value "W" associated with factor F5. It is also seen from the FIG. that the tool has also inserted a dummy level in column four assigned to factor F2 (a two-level factor) in each row representing level three.

When the tool generates the test cases, it then displays them on display 20. At that point, the user may then direct computer 10 to execute the test cases in connection with the associated fictitious "XYZ" command to test a particular software program or circuitry. Alternatively, the user may direct computer 10 to store the test cases in a file for later use. (It is noted that the total number of possible test combinations that may be derived for the input vector associated with the experiment of FIG. 2 is 270. However, that number is reduced to just 18 test cases using orthogonal array L18a2.)

As an aspect of the invention, the user may specify more than one set of parameters for a particular factor and make each such set dependent on a respective value associated with another factor of the experiment. For example, FIG. 10 illustrates an experiment in which three sets of four values, each set 901 through 903 is specified for factor F3. In the experiment, it is assumed that the three sets of parameters 901 through 903 are respectively dependent on the three values specified for factor F3.

When the user inputs via keyboard 15 the factors and their respective levels, the aforementioned tool will select orthogonal array L25 as being the optimal array for generating the respective test cases. A portion of array L25 is shown in FIG. 11. In the manner discussed above, the tool assigns factors F1 through F4 to columns 6, 5, 4 and 3, respectively, of array L25. The tool then generates the respective test cases, as shown in FIG. 12. It is seen from FIGS. 11 and 12 that test case No. 1 calls for first level values. Accordingly, the tool inserts the first level value of each of the associated factors in their respective columns. In doing so, the tool selects the first level value, namely, value "0", from set 901, since that set depends from the first level value "f" of factor F2. Experiment No. 2 (test case No. 2), on the other hand, specifies second level values for columns 3 through 6. Accordingly, the tool in generating test case No. 2 selects the second level value, namely, value "1" from set 902, since that set depends from the second level value "g" of factor F2. It is also seen that for experiment No. 7, columns 3 and 4 call for a three and five level value, respectively. In the respective test case No. 7, the tool has inserted the value "h" as a dummy value for the fifth level value padded onto factor F2 and has inserted the fourth level value "8" of set 903 for factor F3, since set 903 depends from value "h" of factor F2.

The practicality of our invention may be shown by way of example illustrating the generation of test cases used to test a particular capability associated with a network of nodes, as shown in FIG. 12, that is, to remotely control the operation of status alarms associated with respective ones of the nodes. Each of the nodes 1201 through 1207 is a facility operations system that monitors the operation of respective telephone facilities (not shown) and reports various results, i.e., alarm conditions, to a central location. Nodes 1201 through 1207 are interconnected to each other using a so-called ring topology, with equipment, such as, for example, the AT&T DATAKIT virtual circuit switch. As an added aspect, the test needed to account for the possibility that the network would increase, sometime in the future, to, for example, nine nodes (1208 and 1209, not shown). Accordingly, the experiment comprises nine factors F1 through F9 each having two levels, one level being used to turn on the alarms at a node and the other level being used to turn off the alarms. It is noted that all possible combinations of nine 2-level factors would comprise 512 different test cases.

However, the number of test cases decreases to just twelve test cases when they are generated in accordance with the invention, i.e., as a result of selecting orthogonal array L12 as the optimal choice, as shown in FIG. 14. The value of "one" for a particular test case indicates that an alarm associated with a particular node, such as node 1201, represented by factor 1, is placed in an active (on) state. The value of "two" indicates that that alarm is placed in an inactive (off) state.

Figure 15:
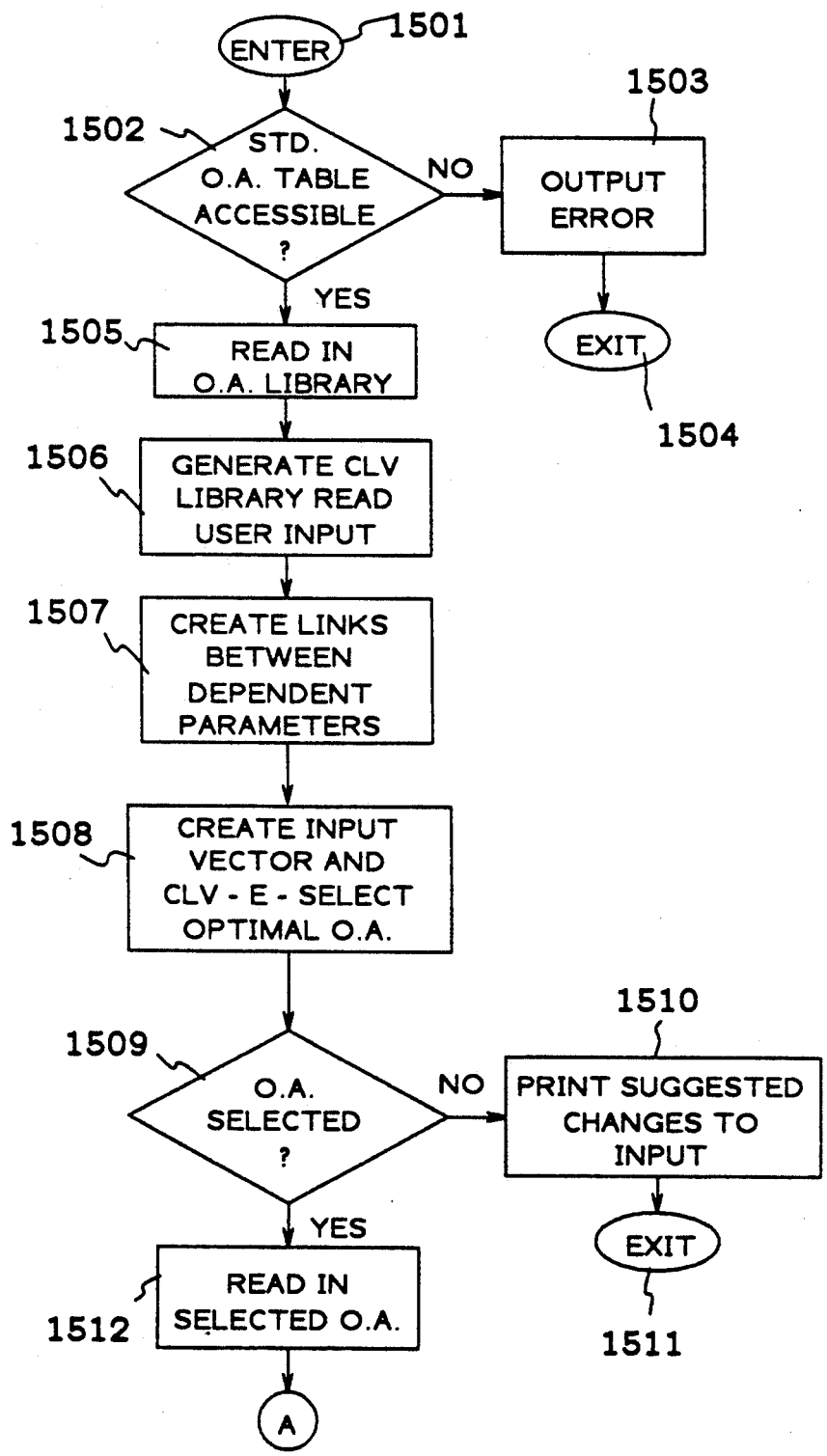
FIGS. 15–16 shows in flow chart form the program which implements the invention in the computer arrangement of FIG. 6.
Figure 16:
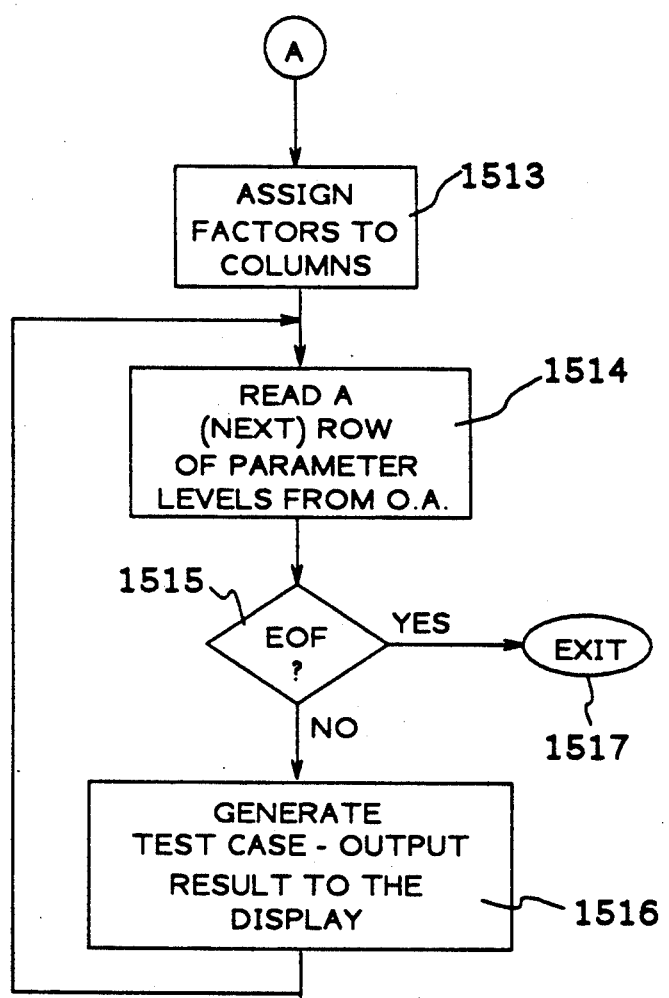
Figure 17:
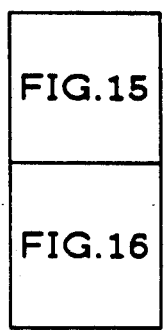
FIG. 17 shows the manner in which FIGS. 15–16 should be arranged.

Referring now to FIG. 15, there is shown the program in flow chart form detailing the logic which implements the invention in computer 10. Upon being invoked, the program proceeds to block 1501 where it initializes various parameters, pointers, etc., internal to the program. The program then proceeds to block 1502 where it checks to see if the library of orthogonal arrays (FIG. 1) is stored in the memory of computer 10. The program proceeds to block 1505 if it finds that to be the case. Otherwise, the program proceeds to block 1503. At block 1503, the program outputs to display 20 an error and then exits via block 1504.

At block 1505, the program stores a copy of the library of orthogonal arrays (O.A.) in local memory, such as so-called RAM memory, and then proceeds to block 1506. At block 1506, the program creates the CLV version (i.e., the library shown in FIG. 5) of the O.A. library obtained at block 1505. (It is noted that, alternatively, a copy of the latter library could be stored in memory and obtained at block 1505, thereby eliminating the program step of block 1506.) In addition, at block 1506, the program reads the data that is being entered by the user, and then proceeds to block 1507 when the user inputs an end of file (i.e., control d).

At block 1507, the program checks the user's input to see if there is a dependency between parameters. If the program finds that to be case, then it creates links between between the parameters in preparation of generating the test cases. The program then proceeds to block 1208 where it forms an input vector from the user's input and then forms the associated CLV-E vector. The program then searches the CLV library created at block 1506 to locate an optimal orthogonal array. At block 1509, the program checks the results of its search and proceeds to block 1510 if it finds that it could not locate an optimal array. Otherwise, it proceeds to block 1512.

At block 1510, the program outputs to display 20 a message suggesting a way that the user may modify the input so that an optimal array may be selected. For example, the program may suggest that at least one level be deleted from one of the input factors. The suggestion is made on the basis that the deleted level could be tested as a separate test case formulated by, for example, the user. The program then exits via block 1511.

At block 1513, the program reads in from main memory, such as ROM memory, a copy of the selected orthogonal array and stores the copy in temporary memory, such as RAM memory. The program then proceeds to block 1513 where it assigns the factors inputted by the user to individual ones of the array columns. The program does this in the manner discussed above. The program then proceeds to block 1514. At block 1514, the program reads a row of levels from the selected O.A. and then proceeds to block 1515. At block 1515, the program checks to see if it has reached the end of the O.A., thereby indicating that the task of generating the respective test cases has been completed. The program exits via block 1517 if it finds that to be the case. Otherwise, it proceeds to block 1516 where it generates, in the manner discussed above, the associated test case using the dependency links that the program may have created at block 1507. The program then outputs the test case to display 20 and then proceeds to block 1514 to generate the next test case using the next row of levels of the selected O.A.

Although a specific embodiment of the invention is shown and described herein, such merely illustrates the principles of the invention. Those skilled in the art will be able to devise other arrangements which, although not specifically shown or described herein, nevertheless embody those principles.

We claim:

1. An arrangement for generating test cases to evaluate a design or operation of a particular apparatus, said arrangement comprising
   a library of orthogonal arrays, said arrays being characterized in said library by respective cumulative level vectors,
   means, responsive to receipt of a plurality of factors each having a respective number of levels, for generating a plurality of values each defining the number of said factors having the same number of said levels, arranging said values in a predetermined order to form a series of values, and then generating a cumulative level input vector as a function of said series, and
   means for selecting from said library one of said arrays and for then generating said test cases using said selected array, said selection being based on a predetermined relationship between each of the values forming said cumulative level input vector and corresponding values of the cumulative level vector characterizing said selected array.

2. The arrangement set forth in claim 1 wherein said relationship is based on the values forming said cumulative level input vector being no larger than said corresponding values.

3. The arrangement set forth in claim 1 wherein said means for generating said test cases includes means responsive to receipt from a user of said arrangement a predetermined software command for associating said command with each of said test cases and for then outputting to an output device the resulting test cases.

4. The arrangement set forth in claim 1 wherein said means for generating said input vector and said means for selecting and generating are respective segments of a software program implemented on a computer.

5. The arrangement set forth in claim 1 wherein at least one of said received factors may be associated with a predetermined number of different sets of said levels each depending on the levels associated with another one of said received factors and wherein said means for generating said test cases includes means for accounting for said dependency as said test cases are being generated.

6. The arrangement set forth in claim 1 wherein each of said orthogonal arrays is defined by a predetermined number of factors each associated with a respective number of levels and wherein each of said cumulative level vectors is derived as a function of the factors and associated levels defining the respective one of said arrays.

7. The arrangement set forth in claim 6 wherein said means for generating said test cases includes means for adding at least one dummy level to at least one of the factors if the number of said received levels associated with that factor is less than the closest corresponding number of levels that is served by said selected array.

8. A method of generating test cases to evaluate a design or operation of a particular apparatus, said method comprising the steps of
   maintaining a library of orthogonal arrays, said arrays being characterized in said library by respective cumulative level vectors,
   responding to receipt of a plurality of factors each having a respective number of levels by generating a plurality of values each defining the number of said factors having the same number of levels, arranging said values in a predetermined order to form a series of values, and generating a cumulative level input vector as a function of said series of values, and
   selecting from said library one of said arrays and then generating said test cases using said selected array, in which said selection is based on a predetermined relationship between the values of said series and corresponding values of the cumulative level vector characterizing said selected array.

* * * * *